United States Patent
Ma et al.

(10) Patent No.: US 9,716,245 B2
(45) Date of Patent: Jul. 25, 2017

(54) ORGANIC ELECTROLUMINESCENT DEVICE AND PREPARATION METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Qun Ma, Beijing (CN); You Tae Won, Beijing (CN); Haidong Wu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/769,262

(22) PCT Filed: Oct. 16, 2014

(86) PCT No.: PCT/CN2014/088708
§ 371 (c)(1),
(2) Date: Aug. 20, 2015

(87) PCT Pub. No.: WO2016/011710
PCT Pub. Date: Jan. 28, 2016

(65) Prior Publication Data
US 2016/0254477 A1    Sep. 1, 2016

(30) Foreign Application Priority Data
Jul. 25, 2014 (CN) .......................... 2014 1 0360463

(51) Int. Cl.
H01L 51/52     (2006.01)
H01L 51/56     (2006.01)
H01L 51/00     (2006.01)

(52) U.S. Cl.
CPC ...... *H01L 51/5209* (2013.01); *H01L 51/0011* (2013.01); *H01L 51/0023* (2013.01); *H01L 51/5225* (2013.01); *H01L 51/56* (2013.01)

(58) Field of Classification Search
CPC . H01L 51/52; H01L 51/5012; H01L 51/5212; H01L 51/5209; H01L 51/5225
See application file for complete search history.

(56) References Cited

U.S. PATENT DOCUMENTS

2006/0172455 A1    8/2006    Winters et al.
2009/0015156 A1    1/2009    Budde et al.
(Continued)

FOREIGN PATENT DOCUMENTS

CN    1447629 A      10/2003
CN    101401226 A    4/2009
(Continued)

OTHER PUBLICATIONS

Second Chinese Office Action dated Aug. 16, 2016; Appln. No. 201410360463.9.
(Continued)

*Primary Examiner* — Phuc Dang
(74) *Attorney, Agent, or Firm* — Ladas & Parry LLP

(57) ABSTRACT

An organic electroluminescent device and a preparation method thereof, and a display device are provided. The organic electroluminescent device comprises a substrate (1), a first electrode (2) formed on the substrate (1), a light-emitting layer (3) formed on one side of the first electrode (2) away from the substrate (1), and a second electrode (4) formed on one side of the light-emitting layer (3) away from
(Continued)

the first electrode (2), and only a portion of a projection of the light-emitting layer (3) on the substrate (1) is positioned at an overlapping portion of projections of the first electrode (2) and the second electrode (4) on the substrate (1). The organic electroluminescent device can facilitate realizing a high resolution design of a display screen.

15 Claims, 1 Drawing Sheet

(56) References Cited

U.S. PATENT DOCUMENTS

| | | | |
|---|---|---|---|
| 2011/0248253 A1 | 10/2011 | Yamana et al. | |
| 2013/0320841 A1* | 12/2013 | Shirai | H01L 51/5212 313/504 |
| 2014/0070248 A1* | 3/2014 | Ushiyama | H01L 33/486 257/98 |
| 2014/0168744 A1* | 6/2014 | Li | G02F 1/155 359/266 |
| 2015/0249230 A1 | 9/2015 | Kido | |

FOREIGN PATENT DOCUMENTS

| | | |
|---|---|---|
| CN | 102257649 A | 11/2011 |
| JP | 2006-253302 A | 9/2006 |
| JP | 2008-294356 A | 12/2008 |

OTHER PUBLICATIONS

International Search Report & Written Opinion of the International Searching Authority Appln. No. PCT/CN2014/088708; Dated Apr. 24, 2015.

First Chinese Office Action Appln. No. 201410360463.9; Dated Jan. 27, 2016.

Third Chinese Office Action dated Jan. 22, 2017; Appln. No. 201410360463.9.

* cited by examiner

US 9,716,245 B2

ORGANIC ELECTROLUMINESCENT DEVICE AND PREPARATION METHOD THEREOF, AND DISPLAY DEVICE

TECHNICAL FIELD

Embodiments of the disclosure relate to an organic electroluminescent device and a preparation method thereof, and a display device.

BACKGROUND

Along with development of display technologies, organic electroluminescent device (OELD) display screens are gradually becoming the mainstream in the market due to advantages such as high response speed, high gamut, ultra-thin profile and so on. An organic electroluminescent device comprises a substrate, and a first electrode, a light-emitting layer and a second electrode formed on the substrate sequentially; the light-emitting layer is totally positioned between the first electrode and the second electrode and emits light under action of the first electrode and the second electrode.

During preparation of the organic electroluminescent device, the light-emitting layer is mainly prepared by an evaporation process, and the light-emitting layer is limited by an evaporation mask process during the preparation. A size of an opening region on an evaporation mask is always limited above a certain level, which results in that the light-emitting layer in the organic electroluminescent device cannot be made smaller, and further, the organic electroluminescent device cannot be used to make a high resolution display screen. Therefore, it is hard for the organic electroluminescent device to realize high resolution of a display screen.

SUMMARY

At least one embodiment of the disclosure provides an organic electroluminescent device, and a preparation method thereof, and a display device, and the organic electroluminescent device is convenient for high resolution design of a display screen.

At least one embodiment of the disclosure provides an organic electroluminescent device, comprising: a substrate, a first electrode formed on the substrate, a light-emitting layer formed on one side of the first electrode away from the substrate, and a second electrode formed on one side of the light-emitting layer away from the first electrode, and only a portion of a projection of the light-emitting layer on the substrate is positioned on an overlapping portion of projections of the first electrode and the second electrode on the substrate.

At least one embodiment of the disclosure further provides a preparation method of an organic electroluminescent device, comprising: forming a pattern of a first electrode, a pattern of a light-emitting layer and a pattern of a second electrode on the substrate sequentially; an overlapping portion of projections of the first electrode and the second electrode on the substrate overlaps a portion of a projection of the light-emitting layer on the substrate.

At least one embodiment of the disclosure further provides a display device comprising the organic electroluminescent device provided in the above technical solution.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a portion but not all of the embodiments of the disclosure. Based on the described embodiments herein, those skilled in the art can obtain other embodiment(s), without any inventive work, which should be within the scope of the disclosure.

Figure 1:
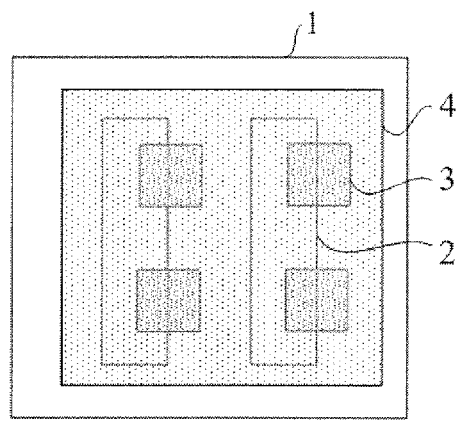
FIG. 1 is a structural schematic diagram of an organic electroluminescent device provided by an embodiment of the disclosure.
Figure 2:
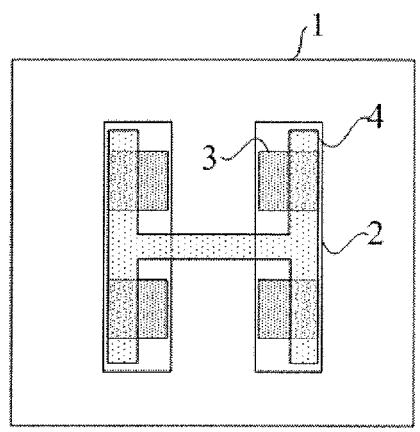
FIG. 2 is a structural schematic diagram of an organic electroluminescent device provided by another embodiment of the disclosure.

FIG. 1 is a structural schematic diagram of an organic electroluminescent device provided by an embodiment of the disclosure; FIG. 2 is a structural schematic diagram of an organic electroluminescent device provided by another embodiment of the disclosure; and FIG. 3 is a structural schematic diagram of an organic electroluminescent device provided by still another embodiment of the disclosure.

Figure 3:
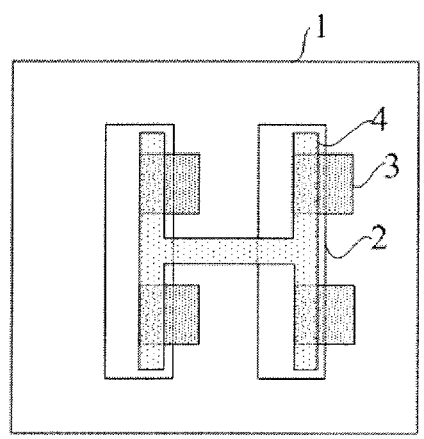
FIG. 3 is a structural schematic diagram of an organic electroluminescent device provided by still another embodiment of the disclosure.

The organic electroluminescent device provided by at least one embodiment of the disclosure comprises: a substrate 1, a first electrode 2 formed on the substrate 1, a light-emitting layer 3 formed on one side of the first electrode 2 away from the substrate 1, and a second electrode 4 formed on one side of the light-emitting layer 3 away from the first electrode 2; and as shown in FIG. 1, FIG. 2 and FIG. 3, only a portion of the projection of the light-emitting layer 3 on the substrate 1 is positioned within an overlapping portion of projections of the first electrode 2 and the second electrode 4 on the substrate 1.

In the organic electroluminescent device, only a portion of the projection of the light-emitting layer 3 on the substrate 1 is positioned within the overlapping portion of projections of the first electrode 2 and the second electrode 4 on the substrate 1, and the rest portion of the light-emitting layer 3 is positioned outside the overlapping portion of the projections of the first electrode 2 and the second electrode 4 on the substrate 1. Because only the portion in the light-emitting layer 3 that is aligned with a space between the first electrode 2 and the second electrode 4 can realize light emitting, only a portion of in the light-emitting layer 3 can emit light while the other portion cannot be used for light emitting.

As in the organic electroluminescent device, the size of the light-emitting layer 3 corresponds to that of an opening region of an evaporation mask, and only a portion of the light-emitting layer 3 can realize light emitting, while the other portion of the light-emitting layer 3 is positioned in a non-light-emitting region of the organic electroluminescent device, the size of the portion for emitting light in the light-emitting layer 3 is smaller than that of the light-emitting layer 3. Therefore, even if the size of the opening region in the evaporation mask is limited above a certain level, the size level of the portion for light emitting in the light-emitting layer 3 can still be smaller than the size level of the opening region in the evaporation mask.

Therefore, the organic electroluminescent device is convenient for high resolution design of a display screen.

As shown in FIG. 1, in one embodiment of the disclosure, the first electrode 2 has a strip structure, and the second electrode 4 has a platy structure; and a portion of the projection of the light-emitting layer 3 on the substrate 1 is positioned in the projection of the first electrode 2 on the substrate 1.

As shown in FIG. 2, in another embodiment of the disclosure, the first electrode 2 has a strip structure, and second electrode 4 has a strip structure; the projection of the light-emitting layer 3 on the substrate 1 is all positioned in the projection of the first electrode 2 on the substrate 1, while only a portion of the projection overlaps with the projection of the second electrode 4 on the substrate 1.

Or, as shown FIG. 3, in still another embodiment of the disclosure, the first electrode 2 has a strip structure, and the second electrode 4 has a strip structure; of the projection of the light-emitting layer 3 on the substrate 1, at least a portion overlaps with the projection of the first electrode 2 on the substrate 1, and only a portion overlaps with the projection of the second electrode 4 on the substrate 1.

In the organic electroluminescent device with three structures as shown FIG. 1, FIG. 2 and FIG. 3, only a portion of the light-emitting layer 3 is enabled to emit light, so it facilitates achieving the high resolution design of a display screen.

In at least one embodiment of the disclosure:

The first electrode 2 is an anode, and the second electrode 4 is a cathode; or, the first electrode 2 is a cathode and the second electrode 4 is an anode. For example, the anode can be a transparent anode, and the cathode is a transparent or semi-transparent cathode so as to improve aperture ratio and light extracting rate of the organic electroluminescent device.

At least one embodiment of the disclosure further provides a preparation method of the organic electroluminescent device provided by the above embodiment, comprising: forming a pattern of a first electrode, a pattern of a light-emitting layer and a pattern of a second electrode on the substrate sequentially; an overlapping portion of projections of the first electrode and the second electrode on the substrate overlaps with a portion of a projection of the light-emitting layer on the substrate.

In one embodiment of the disclosure, for the step of forming the pattern of the first electrode, the pattern of the light-emitting layer and the pattern of the second electrode on the substrate sequentially, one specific example may include following steps of: forming a first electrode layer on the substrate, and forming the pattern of the first electrode with a strip structure by a patterning process; forming an organic layer on the pattern of the first electrode, and forming the pattern of the light-emitting layer by a patterning process, wherein, during the period when the pattern of the light-emitting layer is formed by the patterning process, a region where the light-emitting layer is formed in a mask and the pattern of the first electrode are staggered/offset to enable only a portion of the projection of the formed light-emitting layer on the substrate to be positioned in the projection of the first electrode on the substrate; and forming a second electrode layer on the pattern of the light-emitting layer to form a second electrode with a platy structure.

The organic electroluminescent device with a structure as shown in FIG. 1 can be obtained by the preparation method.

In another embodiment of the disclosure, for the step of forming the pattern of the first electrode, the pattern of the light-emitting layer and the pattern of the second electrode on the substrate sequentially, one specific example may include following steps of: forming a first electrode layer on the substrate, forming the pattern of the first electrode with a strip structure by a patterning process; forming an organic layer on the pattern of the first electrode, and forming the pattern of the light-emitting layer by a patterning process, wherein, during the period when the pattern of the light-emitting layer is formed by the patterning process, a region where the light-emitting layer is formed in a mask and the pattern of the first electrode are staggered/offset to enable only a portion of the projection of the formed light-emitting layer on the substrate to be positioned in the projection of the first electrode on the substrate; and forming a second electrode layer on the pattern of the light-emitting layer to form the pattern of the second electrode with a platy structure by a patterning process, wherein, during the period when the pattern of the second electrode is formed by the patterning process, an overlapping portion of a projection of a region where the pattern of the second electrode is formed in a mask and the projection of the first electrode on the substrate overlaps with only a portion of the projection of the light-emitting layer on the substrate.

The organic electroluminescent device with a structure as shown in FIG. 3 can be obtained by the preparation method.

In still another embodiment of the disclosure, for the step of forming the pattern of the first electrode, the pattern of the light-emitting layer and the pattern of the second electrode on the substrate sequentially recorded in the preparation method of the organic electroluminescent device, one specific example may further include following steps of: forming a first electrode layer on the substrate, forming the pattern of the first electrode with a strip structure by a patterning process; forming an organic layer on the pattern of the first electrode, and forming the pattern of the light-emitting layer by a patterning process, wherein, during the period when the pattern of the light-emitting layer is formed by the patterning process, a projection of a region where the light-emitting layer is formed in a mask on the substrate is positioned in the projection of the first electrode on the substrate; and forming a second electrode layer on the pattern of the light-emitting layer to form the pattern of the second electrode with a platy structure by a patterning process, wherein, during the period when the pattern of the second electrode is formed by the patterning process, an overlapping portion of a projection of a region where the pattern of second electrode is formed in a mask and a projection of the first electrode on the substrate overlaps with only a portion of the projection of the light-emitting layer on the substrate.

The organic electroluminescent device with a structure as shown in FIG. 2 can be obtained by the preparation method.

In the organic electroluminescent device with the three structures as shown FIG. 1, FIG. 2 and FIG. 3, only a portion in the light-emitting layer 3 is enabled to emit light, so it facilitates achieving the high resolution design of a display screen; and by adopting the preparation method to prepare the organic electroluminescent device, the high resolution design of the display screen is convenient to realize.

At least one embodiment of the disclosure further provides a display device comprising the organic electroluminescent device provided by the above embodiment of the disclosure, which can realize high resolution design. The display device can be any product or part with a display function, such as a liquid crystal panel, electronic paper, a liquid crystal television, a liquid crystal display, a digital frame, a cellphone, a tablet computer and a watch with a display function.

The foregoing embodiments merely are exemplary embodiments of the disclosure, and not intended to define the scope of the disclosure, and the scope of the disclosure is determined by the appended claims.

The application claims priority of Chinese Patent Application No. 201410360463.9 filed on Jul. 25, 2014, the disclosure of which is incorporated herein by reference in its entirety as portion of the present application.

The invention claimed is:

1. An organic electroluminescent device, comprising: a substrate, a first electrode formed on the substrate, a light-emitting layer formed on one side of the first electrode away from the substrate, and a second electrode formed on one side of the light-emitting layer away from the first electrode,
   wherein, only a portion of a projection of the light-emitting layer on the substrate is positioned on an overlapping portion of projections of the first electrode and the second electrode on the substrate.

2. The organic electroluminescent device according to claim 1, wherein, the first electrode has a strip structure, and the second electrode has a platy structure; and a portion of the projection of the light-emitting layer on the substrate is positioned in the projection of the first electrode on the substrate.

3. The organic electroluminescent device according to claim 1, wherein, the first electrode has a strip structure, and the second electrode has a strip structure; and in the projection of the light-emitting layer on the substrate, at least one portion overlaps with the projection of the first electrode on the substrate, and only a portion overlaps with the projection of the second electrode on the substrate.

4. The organic electroluminescent device according to claim 1, wherein, the first electrode is an anode, and the second electrode is a cathode; or, the first electrode is a cathode and the second electrode is an anode.

5. A preparation method of an organic electroluminescent device, comprising:
   forming a pattern of a first electrode, a pattern of a light-emitting layer and a pattern of a second electrode on the substrate sequentially,
   wherein, an overlapping portion of projections of the first electrode and the second electrode on the substrate overlaps with a portion of a projection of the light-emitting layer on the substrate.

6. The preparation method according to claim 5, wherein, forming a first electrode layer on the substrate, and forming the pattern of the first electrode with a strip structure by a patterning process;
   forming an organic layer on the pattern of the first electrode, and forming the pattern of the light-emitting layer by a patterning process, wherein, during a period when the pattern of the light-emitting layer is formed by the patterning process, a region where the light-emitting layer is formed in a mask and the pattern of the first electrode are staggered to enable only a portion of the projection of the formed light-emitting layer on the substrate to be positioned in the projection of the first electrode on the substrate; and
   forming a second electrode layer on the pattern of the light-emitting layer to form the pattern of the second electrode with a platy structure.

7. The preparation method according to claim 5, wherein,
   forming a first electrode layer on the substrate, and forming the pattern of the first electrode with a strip structure by a patterning process;
   forming an organic layer on the pattern of the first electrode, and forming the pattern of the light-emitting layer by a patterning process, wherein, during a period when the pattern of the light-emitting layer is formed by the patterning process, a region where the light-emitting layer is formed in a mask and the pattern of the first electrode are staggered to enable only a portion of the projection of the formed light-emitting layer on the substrate to be positioned in the projection of the first electrode on the substrate; and
   forming a second electrode layer on the pattern of the light-emitting layer to form the pattern of the second electrode with a platy structure by a patterning process, wherein, during a period when the pattern of the second electrode is formed by the patterning process, an overlapping portion of a projection of a region where the pattern of the second electrode is formed in a mask and the projection of the first electrode on the substrate overlaps with only a portion of the projection of the light-emitting layer on the substrate.

8. The preparation method according to claim 5, wherein,
   forming a first electrode layer on the substrate, and forming the pattern of the first electrode with a strip structure by a patterning process;
   forming an organic layer on the pattern of the first electrode, and forming the pattern of the light-emitting layer by a patterning process, wherein, during a period when the pattern of the light-emitting layer is formed by the patterning process, a projection of a region where the light-emitting layer is formed in a mask on the substrate is positioned in the projection of the first electrode on the substrate; and
   forming a second electrode layer on the pattern of the light-emitting layer to form the pattern of the second electrode with a platy structure by a patterning process, wherein, during a period when the pattern of the second electrode is formed by the patterning process, an overlapping portion of a projection of a region where the pattern of the second electrode is formed in a mask and the projection of the first electrode on the substrate overlaps with only a portion of the projection of the light-emitting layer on the substrate.

9. The preparation method according to claim 5, wherein, the first electrode is an anode, and the second electrode is a cathode; or, the first electrode is a cathode and the second electrode is an anode.

10. A display device, comprising the organic electroluminescent device according to claim 1.

11. The organic electroluminescent device according to claim 2, wherein, the first electrode is an anode, and the second electrode is a cathode; or, the first electrode is a cathode and the second electrode is an anode.

12. The organic electroluminescent device according to claim 3, wherein, the first electrode is an anode, and the second electrode is a cathode; or, the first electrode is a cathode and the second electrode is an anode.

13. The preparation method according to claim 6, wherein, the first electrode is an anode, and the second electrode is a cathode; or, the first electrode is a cathode and the second electrode is an anode.

14. The preparation method according to claim 7, wherein, the first electrode is an anode, and the second electrode is a cathode; or, the first electrode is a cathode and the second electrode is an anode.

15. The preparation method according to claim 8, wherein, the first electrode is an anode, and the second electrode is a cathode; or, the first electrode is a cathode and the second electrode is an anode.

* * * * *